(12) United States Patent
Hon et al.

(10) Patent No.: US 8,686,462 B2
(45) Date of Patent: Apr. 1, 2014

(54) OPTOELECTRONIC DEVICE

(71) Applicant: Epistar Corporation, Hsinchu (TW)

(72) Inventors: Schang-Jing Hon, Hsinchu (TW);
Chao-Hsing Chen, Hsinchu (TW);
Chien-Fu Shen, Hsinchu (TW);
Jia-Kuen Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/666,561

(22) Filed: Nov. 1, 2012

(65) Prior Publication Data
US 2013/0113014 A1    May 9, 2013

(30) Foreign Application Priority Data
Nov. 3, 2011 (TW) .............................. 100140238 A

(51) Int. Cl.
*H01L 33/00* (2010.01)
(52) U.S. Cl.
USPC .................... 257/99; 257/E31.124

(58) Field of Classification Search
USPC .............................................. 257/99, E31.124
See application file for complete search history.

(56) References Cited

U.S. PATENT DOCUMENTS

| 8,344,392 B2 * | 1/2013 | Yeh et al. ................. 257/79 |
| 2012/0032198 A1 * | 2/2012 | Yeh et al. ................. 257/88 |
| 2012/0049234 A1 * | 3/2012 | Cheng ................. 257/99 |

* cited by examiner

*Primary Examiner* — Trung Q Dang
(74) *Attorney, Agent, or Firm* — Patterson & Sheridan, LLP

(57) ABSTRACT

The application provides an optoelectronic device structure, comprising a semiconductor stack, comprising a first conductivity type semiconductor layer, an active layer, and a second conductivity type semiconductor layer; a first electrode electrically connecting with the first conductivity type semiconductor layer, and further comprising a first extension electrode; a second electrode electrically connecting with the second conductivity type semiconductor layer; and a plurality of electrical restraint contact areas between the semiconductor stack and the first extension electrode, wherein the plurality of electrical restraint contact areas is distributed in a variable interval.

9 Claims, 5 Drawing Sheets

US 8,686,462 B2

OPTOELECTRONIC DEVICE

RELATED APPLICATIONS

The present application claims the right of priority based on Taiwan Patent Application No. 100140238 entitled "OPTOELECTRONIC DEVICE", filed on Nov. 3, 2011, and is incorporated herein by reference in its entirety and assigned to the assignee herein.

TECHNICAL FIELD

The present application relates to an optoelectronic device and a method for manufacturing the same, and more particularly to an optoelectronic device which is provided with an electrical restraint contact area for improving the current crowding.

BACKGROUND

Light-emitting diode is a kind of semiconductor device used widely as a light source. Light-emitting diode has the advantages of power-saving and long lifetime compared to traditional light source such as incandescent bulb and fluorescent lamp. Thus, light-emitting diode has gradually replaced the traditional light source to be applied to various fields such as traffic signs, backlight module, street lights, and medical equipment, etc.

As the brightness of light-emitting diode is demanded to be higher, the industry has focused on how to improve the lighting efficiency to increase the brightness.

FIG. 1 shows a known LED package 10 of the semiconductor lighting device comprises the semiconductor LED chip 12 encapsulated in encapsulation 11, wherein the semiconductor LED chip 12 comprises a p-n junction 13, and encapsulation 11 is usually made of thermosetting material, such as epoxy, or thermoplastic material. The semiconductor LED chip 12 is connected with two conductive frames 15, 16 by a wire 14. Because epoxy would degrade at high temperature, it is only used in low temperature environment. Besides, epoxy with high thermal resistance provides the semiconductor LED chip 12 high resistance heat dissipation paths and limits the application of LED package 10 in the low power consumption.

SUMMARY

The application provides an optoelectronic device, comprising: a semiconductor stack, comprising a first conductivity type semiconductor layer, an active layer, and a second conductivity type semiconductor layer; a first electrode electrically connecting with the first conductivity type semiconductor layer, and further comprising a first extension electrode; and a plurality of electrical restraint contact areas between the semiconductor stack and the first extension electrode, wherein the plurality of electrical restraint contact areas is distributed in a variable interval.

The application provides an optoelectronic device, comprising: a semiconductor stack, comprising a first conductivity type semiconductor layer, an active layer, and a second conductivity type semiconductor layer; a first electrode on the semiconductor stack and electrically connecting with the first conductivity type semiconductor layer, wherein the first electrode further comprising a first extension electrode with a width $D_2$; a groove between the semiconductor stack, wherein the groove is extended from the second conductivity type semiconductor layer down to the first conductivity type semiconductor layer to expose the first conductivity type semiconductor layer at the bottom of the groove; an electrical restraint contact area on the second conductivity type semiconductor layer; and a second conductivity type contact layer between the second conductivity type semiconductor layer and the electrical restraint contact area and is divided by the groove, wherein divided distance between the second conductivity type semiconductor layer is $D_1$, and $D_1$ is smaller than $D_2$.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein.

DETAILED DESCRIPTION OF THE PREFERRED EMBODIMENTS

The present application discloses an optoelectronic device and a method for manufacturing the same. In order to make the illustration of the present application more explicit, the following description is stated with reference to FIG. 2 through FIG. 4D.

Figure 1:
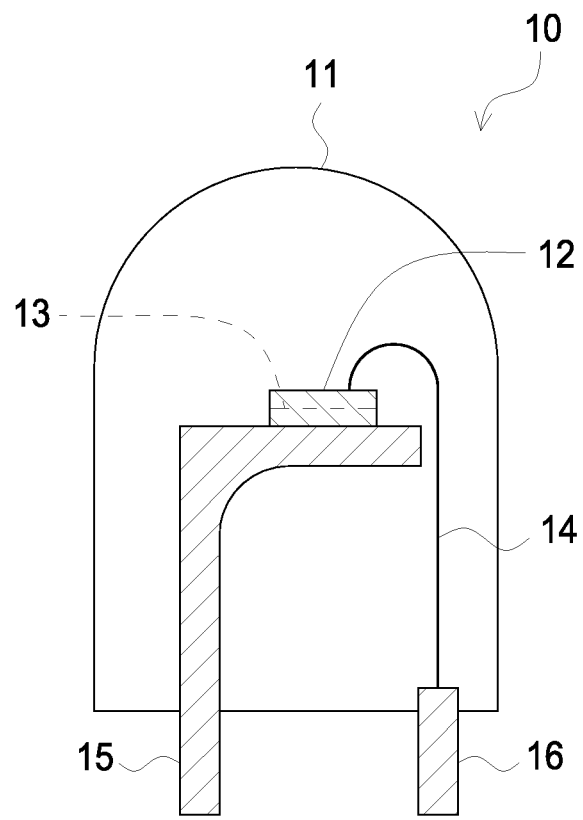
FIG. 1 shows a known LED package of the semiconductor lighting device.
Figure 2:
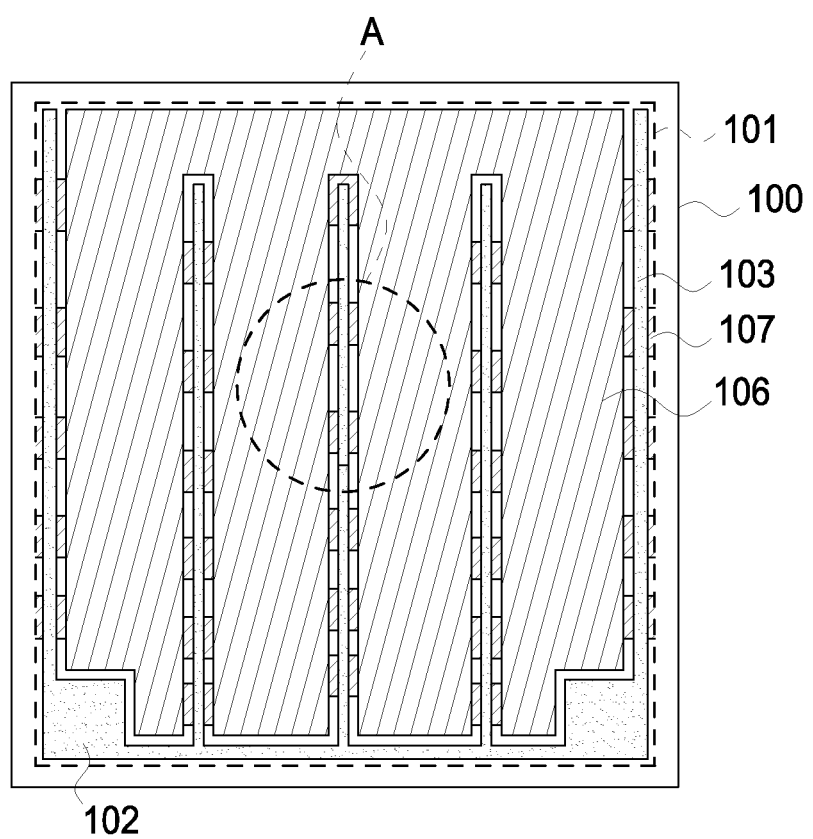
FIG. 2 is a top view of an optoelectronic device in accordance with the first embodiment of the present application.

The below figure is a top view of an optoelectronic device in accordance with the first embodiment of the present application, as FIG. 2 shows, an optoelectronic device comprises a substrate 100, a first conductivity type semiconductor layer 101, a first electrode 102 and a first extension electrode 103 extending from the first electrode 102. An active layer (not shown) and a second conductivity type semiconductor layer (not shown) are formed on the first conductivity type semiconductor layer 101, and a second electrode 106 is formed on the second conductivity type semiconductor layer (not shown). In this embodiment, the first extension electrode 103 is a comb shape, in another embodiment, the first extension electrode 103 can be a curve or other symmetrical or asymmetrical shapes. Besides, a plurality of electrical restraint contact areas 107 is formed between the first conductivity type semiconductor layer 101 and the first extension electrode 103, wherein the plurality of electrical restraint contact areas 107 is distributed in a variable interval. In one embodiment, the interval of the plurality of electrical restraint contact areas 107 is increased with the distance which between the electrical restraint contact areas 107 and the first electrode 102 is increased, so the interval of the electrical restraint contact area is smaller when close to the first electrode 102, and a smaller current is injected. The interval of the electrical restraint contact area is bigger when is away from the first electrode 102, and a larger current is injected. Therefore, the current crowding is alleviated.

Figure 3A:
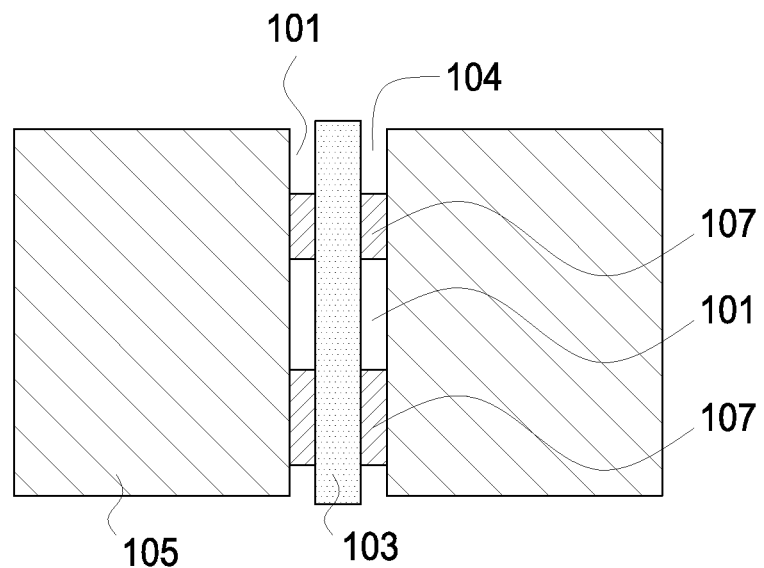
FIGS. 3A-3B are enlarged views of the area A in FIG. 2.
Figure 3B:
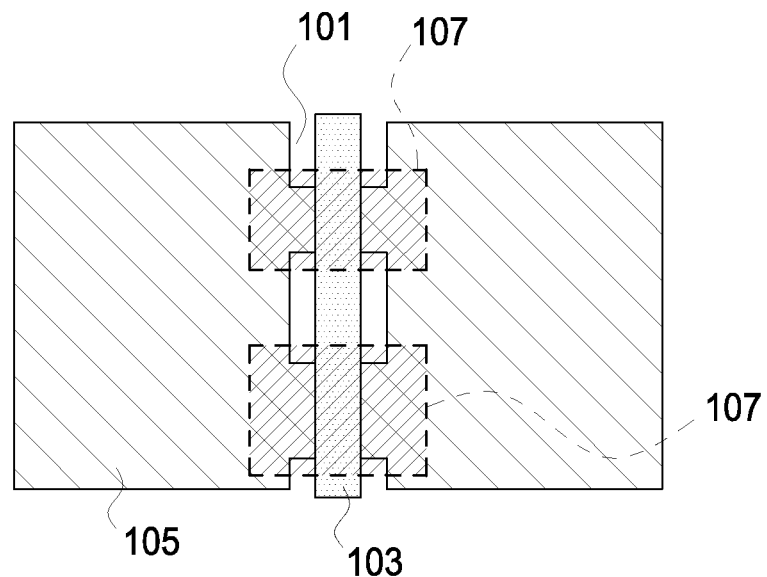

FIG. 3A is an enlarged view of the area A of FIG. 2, as FIG. 3A shows, a groove 104 is formed by etching the second conductivity type semiconductor layer 105 and the active layer (not shown) away until the first conductivity type semiconductor layer 101 is exposed. The plurality of electrical restraint contact areas 107 is formed on the predetermined sites of the groove and is electrically insulative with each other. Then the first extension electrode 103 is formed on the plurality of electrical restraint contact areas 107 and the exposed first conductivity type semiconductor layer 101. FIG. 3B is another enlarged drawing of the area A in FIG. 2. As FIG. 3A shows, etching the second conductivity type semiconductor layer 105 and the active layer (not shown) away until the first conductivity type semiconductor layer 101 is exposed, then the partial second conductivity type semiconductor layer 105 and the partial active layer (not shown) remain. The plurality of electrical restraint contact areas 107 is formed on the exposed partial region of the first conductivity type semiconductor layer 101 and the partial of the second conductivity type semiconductor layer 105, then the first extension electrode 103 is formed on the plurality of electrical restraint contact areas 107 and the exposed first conductivity type semiconductor layer 101.

Figure 4A:
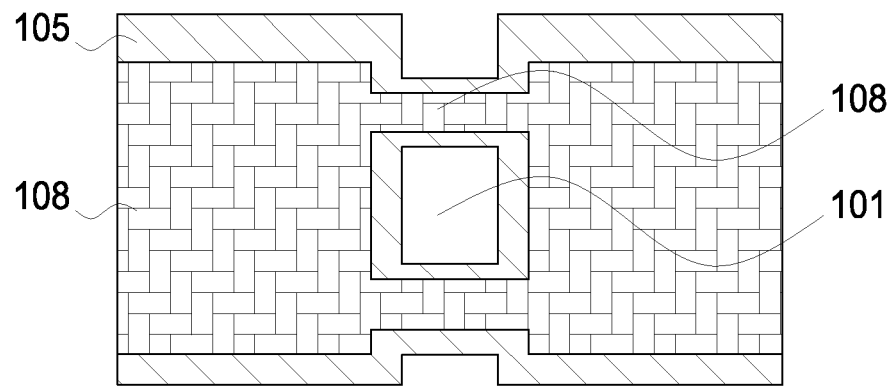
FIGS. 4A-4C are another enlarged views of the area A in FIG. 2.
Figure 4B:
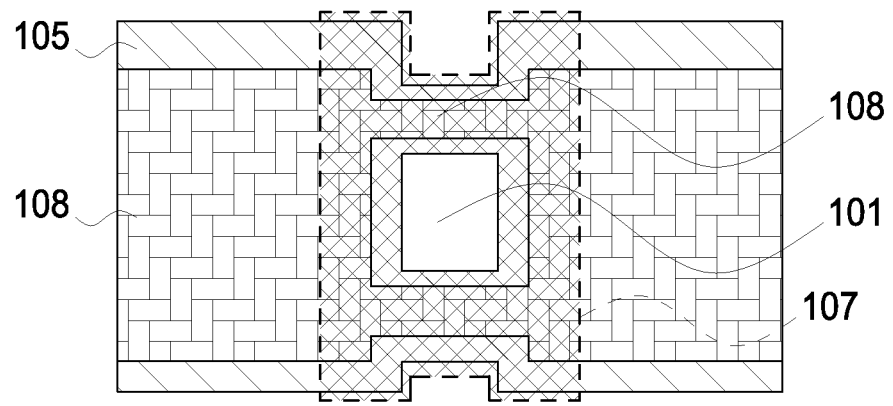
Figure 4C:
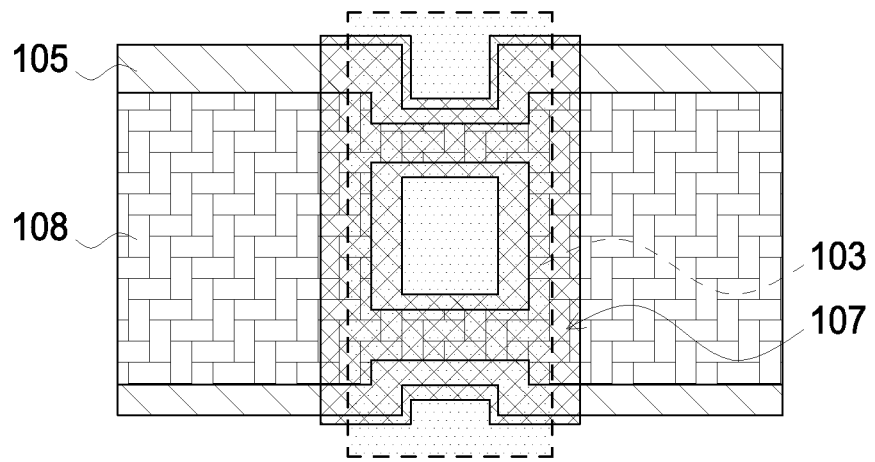
Figure 4D:
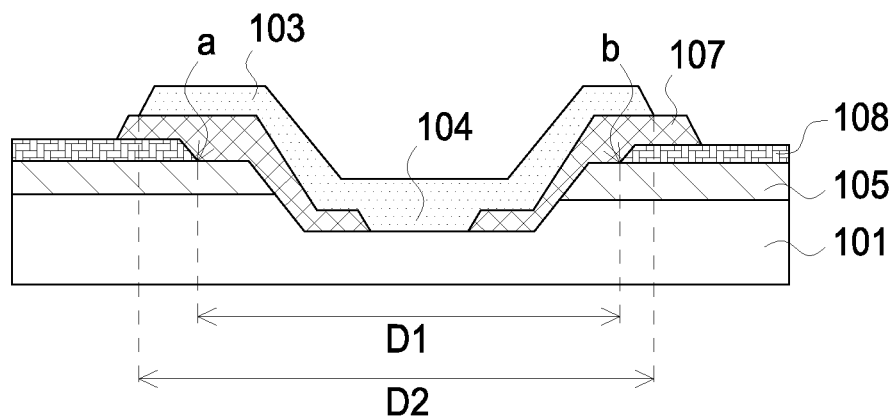
FIG. 4D is a cross-sectional view of FIG. 4C.

FIGS. 4A-4D are another enlarged views of the area A in FIG. 2. As FIG. 4A shows, a second conductivity type contact layer 108 is formed on a part of the second conductivity type semiconductor layer 105. A part of the second conductivity type contact layer 108, the second conductivity type semiconductor layer 105, and the active layer (not shown) are etched away until the first conductivity type semiconductor layer 101 is exposed, and a part of the second conductivity type contact layer 108, the second conductivity type semiconductor layer 105, and the partial active layer (not shown) remain. As FIG. 4B shows, an electrical restraint contact area 107 is formed on the second conductivity type contact layer 108, and the region of the first conductivity type semiconductor layer 101 not covered by the electrical restraint contact area 107 is exposed like what is shown in FIG. 4A. As FIG. 4C shows, the first extension electrode 103 is formed on the electrical restraint contact area 107 and covers the exposed region of the first conductivity type semiconductor layer 101 shown in FIG. 4A, wherein the first extension electrode 103 is electrically connected with the first conductivity type semiconductor layer 101. FIG. 4D is a cross-sectional view of FIG. 4C. As FIG. 4D shows, a groove 104 is formed on the exposed region of the first conductivity type semiconductor layer 101 as shown in FIG. 4A, which is extended from the second conductivity type semiconductor layer 105 down to the first conductivity type semiconductor layer 101 to expose the first conductivity type semiconductor layer 101 at the bottom of the groove. The electrical restraint contact area 107 is formed on the second conductivity type semiconductor layer 105, and is extended along a sidewall of the groove 104 to the partial region of the bottom of the groove. The second conductivity type contact layer 108 is formed between the second conductivity type semiconductor layer 105 and the electrical restraint contact area 107. The second conductivity type contact layer 108 respectively on the two sides of the groove is separated with a distance $D_1$ (between a and b), and a width of the first extension electrode 103 is $D_2$. When $D_1 < D_2$, the current crowding problem is alleviated. The width $D_2$ of the first extension electrode 103 can be between 5 μm-100 μm, 5 μm-80 μm, 5 μm-60 μm, 5 μm-40 μm, 5 μm-20 μm, or 5 μm-10 μm. When the D2 is increased, the driving voltage $V_f$ of the optoelectronic device is decreased.

In the above embodiments, the first electrode 102, the first extension electrode 103, and the second electrode 106 can be made of metal material such as Cr, Ti, Ni, Pt, Cu, Au, Al, W, Sn, Ag, or the combination thereof. In the above embodiments, the electrical restraint contact area 107 can be made of dielectric material such as silicon oxide, silicon nitride, aluminum oxide, zirconium oxide, or titanium oxide.

Specifically, the optoelectronic device comprises light-emitting diode (LED), photodiode, photo resister, laser, infrared emitter, organic light-emitting diode or solar cell. The substrate 100 can be a growing or/and carrying base. The material of the substrate 100 comprises an electrically conductive substrate, electrically insulating substrate, transparent substrate, or opaque substrate. The material of the electrically conductive substrate can be metal such as Cu or Ge, or GaAs, InP, SiC, Si, LiAlO$_2$, ZnO, GaN, AlN. The material of the transparent substrate can be chosen from sapphire (Al$_2$O$_3$), LiAlO$_2$, ZnO, GaN, AlN, glass, diamond, CVD diamond, diamond-like carbon (DLC), spinel (MgAl$_2$O$_4$), SiO$_x$, or LiGaO$_2$.

The first conductivity type semiconductor layer 101 and the second conductivity type semiconductor layer 105 are different in electricity, polarity or dopant, or are the different semiconductor materials used for providing electrons and holes, wherein the semiconductor material can be single semiconductor material layer or multiple semiconductor material layers. The polarity can be chosen from any two of p-type, n-type and i-type. The active layer (not shown) is disposed between the first conductivity type semiconductor layer 101 and the second conductivity type semiconductor layer 105 where the electrical energy and the light energy can be converted or stimulatively converted. The devices which can convert or stimulatively convert the electrical energy into the light energy are like light-emitting diode, liquid crystal display, and organic light-emitting diode. The devices which can convert or stimulatively convert the light energy into the electrical energy are like solar cell and optoelectronic diode. The material of the first conductivity type semiconductor layer 101, the active layer (not shown) and the second conductivity type semiconductor layer 105 comprises Ga, Al, In, As, P, N, Si, or the combination thereof.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can be such as AlGaInP series, AlGaInN series, or ZnO series. The structure of the active layer (not shown) can be single heterostructure (SH), double heterostructure (DH), double-side double heterostructure (DDH) or multi-quantum well (MQW), wherein the wavelength of the light emitted from the active layer (not shown) can be changed by adjusting the number of the pairs of MQW.

In one embodiment of the application, a buffer layer (not shown) can be selectively disposed between the first conductivity type semiconductor layer 101 and the substrate 100. The buffer layer is between the two material systems to transit the material system of the substrate 100 to the material system of the first conductivity type semiconductor layer 101. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AlN or GaN, and the buffer layer can be formed by sputtering or atomic layer deposition (ALD).

The second conductivity type contact layer 108 can be selectively formed on the second conductivity type semiconductor layer 105. The conductivity type contact layer 108 is disposed on the side of the second conductivity type semiconductor layer 105 away from the active layer (not shown). Specifically, the second conductivity type contact layer 108 can be optical layer, electrical layer, or the combination thereof. The optical layer can change the radiation or the light from or entering the active layer (not shown), wherein the optical layer can change but not limited to the frequency, the wavelength, the intensity, the flux, the efficiency, the color temperature, rendering index, light field, angle of view. The electrical layer can change the value, density, distribution of voltage, resistor, current and capacitance of any two relative sides of the contacting layer. The material of the second conductivity type contact layer 108 comprises oxide such as conductive oxide, transparent oxide and the oxide with the transparency over 50%, metal such as transparent metal and the metal with transparency over 50%, organic material, inorganic material, fluoresce material, ceramic, semiconductor material or doping semiconductor material. In some applications, the material of the second conductivity type contact layer 108 can be InTiO, CdSnO, SbSnO, InZnO, ZnAlO or ZnSnO. If the material of the second conductivity type contact layer 108 is transparent metal, the thickness of the contacting layer is in a range of 0.005 μm~0.6 μm.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device, comprising:
   a semiconductor stack, comprising a first conductivity type semiconductor layer, an active layer, and a second conductivity type semiconductor layer;
   a first electrode electrically connecting with the first conductivity type semiconductor layer and further comprising a first extension electrode; and
   a plurality of electrical restraint contact areas between the semiconductor stack and the first extension electrode, wherein the plurality of electrical restraint contact areas is distributed in a variable interval, wherein the interval of the plurality of electrical restraint contact areas is increased with an increase of a distance which between the electrical restraint contact areas and the first electrode.

2. The optoelectronic device according to claim 1, further comprising a substrate formed on the semiconductor stack, wherein the substrate and the first electrode are formed on the opposite sides of the semiconductor stack.

3. The optoelectronic device according to claim 1, further comprising a second electrode electrically connected with the second conductivity type semiconductor layer.

4. An optoelectronic device, comprising:
   a semiconductor stack, comprising a first conductivity type semiconductor layer, an active layer, and a second conductivity type semiconductor layer;
   a first electrode on the semiconductor stack and electrically connecting with the first conductivity type semiconductor layer, wherein the first electrode comprises a first extension electrode with a width $D_2$;
   a groove between the semiconductor stack, wherein the groove is extended from the second conductivity type semiconductor layer down to the first conductivity type semiconductor layer to expose the first conductivity type semiconductor layer at the bottom of the groove;
   an electrical restraint contact area on the second conductivity type semiconductor layer; and
   a second conductivity type contact layer between the second conductivity type semiconductor layer and the electrical restraint contact area, wherein the second conductivity type contact layer is divided by the groove, wherein a divided distance between the second conductivity type semiconductor layer is $D_1$, and $D_1$ is smaller than $D_2$.

5. The optoelectronic device according to claim 4, further comprising a substrate formed on the semiconductor stack, wherein the substrate and the first electrode are formed on the opposite sides of the semiconductor stack.

6. The optoelectronic device according to claim 4, further comprising a second electrode electrically connected with the second conductivity type semiconductor layer.

7. The optoelectronic device according to claim 4, wherein the first extension electrode is on the electrical restraint contact area.

8. The optoelectronic device according to claim 4, wherein the width $D_2$ of the first extension electrode between 5 μm and 100 μm.

9. The optoelectronic device according to claim 4, wherein the electrical restraint contact area further extends along a sidewall of the groove and to a partial area of the bottom of the groove.

* * * * *